US007799166B2

(12) United States Patent
Whitefield

(10) Patent No.: US 7,799,166 B2
(45) Date of Patent: Sep. 21, 2010

(54) WAFER EDGE EXPOSE ALIGNMENT METHOD

(75) Inventor: Bruce Whitefield, Camas, WA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 10/944,996

(22) Filed: Sep. 20, 2004

(65) Prior Publication Data

US 2006/0060299 A1    Mar. 23, 2006

(51) Int. Cl.
*H01L 21/306* (2006.01)
(52) U.S. Cl. .............................. 156/345.15; 156/345.55; 134/113
(58) Field of Classification Search ................. 134/113; 156/345.55, 345.15, 345, 345.12, 345.16
See application file for complete search history.

(56) References Cited

U.S. PATENT DOCUMENTS

| | | | | |
|---|---|---|---|---|
| 5,028,955 A * | 7/1991 | Hayashida et al. | ............. | 355/53 |
| 5,361,121 A * | 11/1994 | Hattori et al. | ................. | 355/50 |
| 5,811,211 A * | 9/1998 | Tanaka et al. | ................. | 430/30 |
| 5,880,816 A * | 3/1999 | Mimura et al. | ................ | 355/53 |
| 5,982,474 A * | 11/1999 | Akiyama et al. | ............... | 355/53 |
| 6,000,996 A * | 12/1999 | Fujiwara | ......................... | 451/6 |
| 6,240,874 B1 * | 6/2001 | Pike | ............................. | 118/666 |
| 6,347,291 B1 * | 2/2002 | Berman | ........................ | 702/150 |
| 6,374,834 B1 * | 4/2002 | Abe et al. | ..................... | 134/1.3 |
| 6,495,312 B1 * | 12/2002 | Young et al. | ................. | 430/328 |
| 6,710,886 B2 * | 3/2004 | Park et al. | ..................... | 356/614 |
| 6,721,037 B2 * | 4/2004 | Nagai et al. | .................... | 355/53 |
| 6,874,510 B2 * | 4/2005 | Reder et al. | ................... | 134/1.3 |
| 6,875,306 B2 * | 4/2005 | Tamura | .................. | 156/345.24 |
| 6,923,045 B2 * | 8/2005 | Neo et al. | ...................... | 73/105 |
| 6,936,107 B2 * | 8/2005 | Kitano et al. | ............... | 118/676 |
| 7,013,222 B2 * | 3/2006 | Strader | ......................... | 702/30 |
| 2004/0075822 A1 * | 4/2004 | Hattori | ......................... | 355/72 |
| 2004/0169869 A1 * | 9/2004 | Shin et al. | .................... | 356/635 |
| 2005/0024630 A1 * | 2/2005 | Ohno et al. | ............... | 356/237.1 |
| 2005/0024632 A1 * | 2/2005 | Plemmons et al. | ........ | 356/237.1 |
| 2005/0116187 A1 * | 6/2005 | Uda et al. | ............... | 250/559.45 |

\* cited by examiner

*Primary Examiner*—Sylvia R. MacArthur
(74) *Attorney, Agent, or Firm*—Clark Hill PLC

(57) ABSTRACT

Incorporation of a sensor, such as an optical or laser based sensor, into a wafer edge processing unit, such as a WEE unit or mechanism. This sensor enables the WEE unit to be referenced to the wafer edge. Specifically, the sensor can be used to place a WEE unit in a fixed but accurate location at the beginning of the wafer edge expose process. Another approach is to have the WEE drive controller actively follow the edge of the wafer as it rotates during the WEE process, which has the advantage of compensating for any wafer centering errors as well as diameter and placement errors. In yet another approach, the edge sensor is used to sense and track the edge of a previous layer WEE pattern. The sensor can also facilitate the measuring of a distance from a wafer edge to a WEE edge feature.

6 Claims, 4 Drawing Sheets

Drive a sensor from a WEE edge to either another WEE edge or to the wafer's edge while counting the stepper motor steps Multiply the stepper motor counts by the distance per step to calculate the distance WEE edge features or to the wafer's edge

WAFER EDGE EXPOSE ALIGNMENT METHOD

BACKGROUND

The present invention generally relates to the processing, such as the exposing, of a wafer edge, and more specifically relates to the use of a sensor to more precisely process the edge of wafer.

Getting the maximum usable area and highest yield from a wafer is critical to manufacturing integrated circuits cost effectively. Over the years, a number of methods have been developed to control the film stacks that occur on the wafer edge in order to reduce the defects that they cause. A common technique is to remove the resist build up, known as the edge bead, on the edge of the wafer with a combination of solvent dispense Edge Bead Remover (EBR) and Wafer Edge Expose (WEE). In recent years, additional techniques such as wet edge etching and edge scrub processes have been deployed as well.

While these processes remove or control films that are the source of defects, they do take up some space on the edge of the wafer. Initially, the industry standard for the non-yielding zone at the edge of the wafer, known as the "edge exclusion zone," was 4 millimeters or more. As improved methods for controlling the films in this area became available, it has been possible to reduce this to about 3 millimeters or even 2 millimeters. The IRTS roadmap calls for reducing the edge exclusion zone to 1 millimeter by the year 2006.

The edge exclusion radius that must be used for determining wafer layouts and the number of yieldable die sites (also known as the gross die per wafer) is not actually the physical location of the edge film removals. In order for the die to be yielding at the 3 millimeter location, the physical edge settings must be closer to the edge than that since there are yield loss effects, typically due to CMP processes, that extend some distance from the film removal edge step. In addition, certain films must not be allowed to stack on top of each other or they will cause particle defects, so there must be room to put different layer edges in different locations within the edge zone.

FIG. 1 shows a typical plan for edge exposure settings used for a 3 millimeter edge exclusion strategy. In FIG. 1, reference numeral 10 identifies all BARC layers, reference numeral 12 identifies the darkfield WWE layers, reference numeral 14 identifies the brightfield WWE layers, and reference numeral 16 identifies the contact mask. It can be seen that the furthest inward physical edge (i.e., the edge 18 of the contact mask 16) is actually set at 1.9 millimeters.

Control of the edge removal settings with equipment available today is typically +/−0.2 millimeter. In order to guarantee no overlaps, each setting must be separated by at least 0.4 millimeter with an additional 0.4 millimeter allotted for the curvature at the edge of the wafer. With at least four non-overlapping settings needed (as shown in FIG. 2), this adds up to a minimum of at least 1.6 millimeters needed for physical edge settings.

The value of an extra yieldable millimeter at the edge of the wafer is considerable. For example, the difference between a 3 millimeter and a 2 millimeter edge setting can be worth an additional 10 to 30 die per wafer depending on die size. The increase in gross die per wafer represents a significant financial value for a typical wafer fabricator. Presently, at a run rate of 2000 wafers a week, the extra 12 die in the example above are worth an extra $58,000 per week (or $3,000,000 per year), for no additional processing cost.

In order to meet the IRTS roadmap of 1 millimeter edge exclusion, improvements in two key characteristics must occur:
1) Improve control of the edge film removal processes to +/−0.1 millimeter or less; and
2) Reduce the CMP edge yield effect to less than 0.2 millimeter.

The subject of the present invention is to address the need to improve the edge film removal process to less than +/−0.1 millimeter, particularly the Wafer Edge Expose (WEE) used in photolithography and mask-less wafer edge etch processes, such as W and Low K wet etches, using spin processors.

The existing method for controlling edge removal settings such as the WEE is to use a mechanical set point on the WEE exposure unit and measure the results on the wafer. The edge exposure settings are adjusted on a set frequency and plotted in an SPC control chart. Improved systems utilize a programmable stepper motor to position the WEE unit, and these systems typically have an improved accuracy.

Currently in the industry, the WEE unit position is referenced to the resist coating unit itself and does not account for many key variations such as the placement of the wafer on the unit, variations in wafer diameter, and placement of previous WEE layers. FIG. 2 shows a top view of a wafer 20 and a Wafer Edge Expose unit 22, wherein the wafer is rotated (as represented by arrow 24) under the Wafer Edge Expose unit 22.

FIG. 3 provides a cross sectional view of the wafer 20 and Wafer Edge Expose unit 22. Specifically, reference numeral 26 identifies the vacuum chuck which holds the wafer 20, reference numeral 28 identifies the resist which is on the wafer 20, reference numeral 30 identifies the resist edge bead, reference numeral 32 identifies UV light which is produced by the edge expose unit 22, and reference numeral 34 identifies the wafer edge expose drive motor and controller. FIG. 3 also illustrates the many different tolerances or variations which can add up to an unacceptable WEE placement error. Specifically, reference numeral 36 identifies the wafer centering tolerance, reference numeral 38 identifies the wafer edge expose unit tolerance (i.e., with regard to placement relative to a centerline 39 of the chuck), and reference numeral 40 identifies the wafer diameter tolerance.

OBJECTS AND SUMMARY

An object of an embodiment of the present invention is to provide a method and apparatus for better aligning a wafer edge processing unit, such as a wafer edge expose unit, with regard to a wafer edge.

Another object of an embodiment of the present invention is to provide a method and apparatus which compensates for tolerances when aligning a wafer edge processing unit, such as a wafer edge expose unit, with regard to a wafer edge.

Yet another object of an embodiment of the present invention is to provide a method and apparatus for dynamically tracking a wafer edge, such as during wafer edge processing.

Briefly, and in accordance with at least one of the foregoing objects, an embodiment of the present invention provides for the incorporation of a sensor, such as an optical or laser based sensor, into a wafer edge processing unit, such as a WEE unit or mechanism. This sensor enables the wafer edge processing unit to be referenced to the wafer edge. Specifically, the sensor can be used to place a WEE unit in a fixed but accurate location at the beginning of the WEE process. Another approach is to have the WEE drive controller actively follow the edge of the wafer as it rotates during the WEE process, which has the advantage of compensating for any wafer centering errors as well as diameter and placement errors. In another approach, the edge sensor is used to sense and track the edge of a previous layer WEE pattern. The sensor can also facilitate the measuring of a distance from a wafer edge to a WEE edge feature.

BRIEF DESCRIPTION OF THE DRAWINGS

The organization and manner of the structure and operation of the invention, together with further objects and advantages thereof, may best be understood by reference to the following description, taken in connection with the accompanying drawings, wherein.

DESCRIPTION

Figure 1:
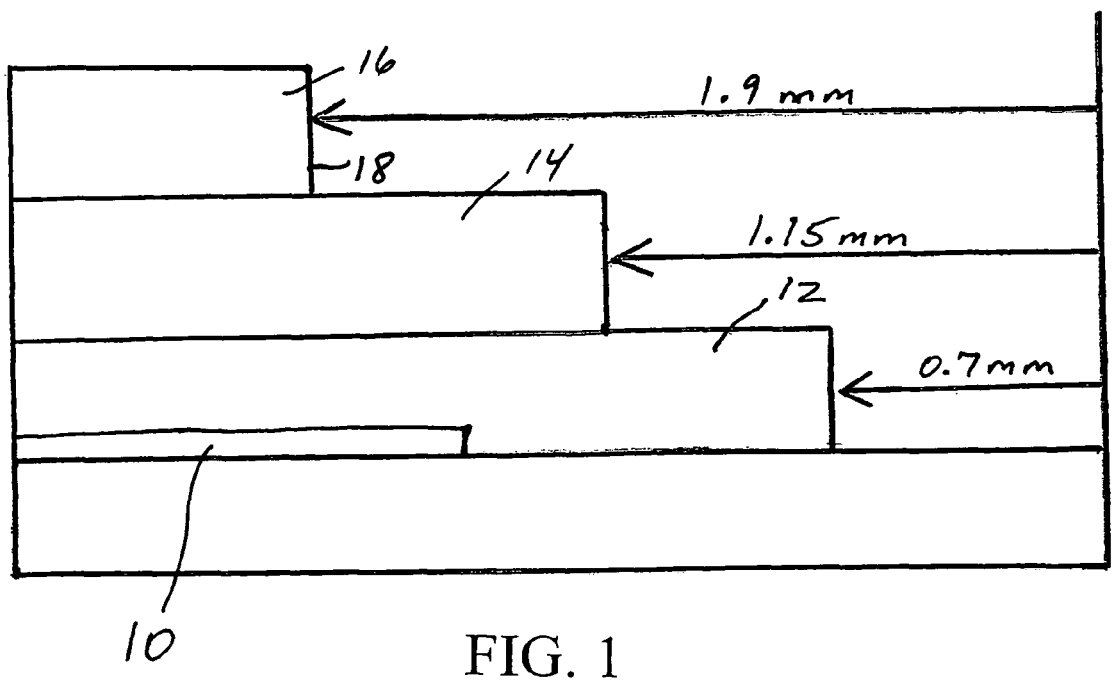
FIG. 1 shows a typical plan for edge exposure settings used for a 3 millimeter edge exclusion strategy.

While the invention may be susceptible to embodiment in different forms, there are shown in the drawings, and herein will be described in detail, specific embodiments of the invention. The present disclosure is to be considered an example of the principles of the invention, and is not intended to limit the invention to that which is illustrated and described herein.

Figure 2:
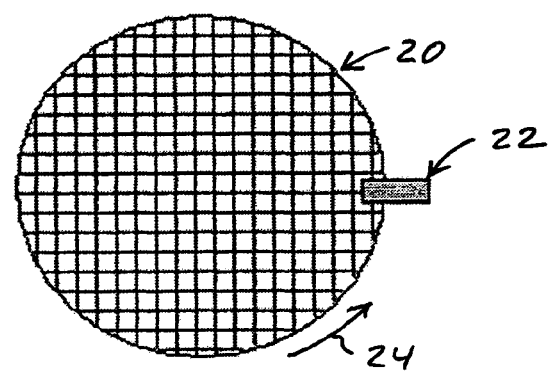
FIG. 2 provides a top view of a Wafer Edge Expose Process.

The present invention provides a method and apparatus for better aligning a wafer edge processing unit, such as a wafer edge expose unit, with regard to a wafer edge. As discussed above, FIGS. 2 and 3 illustrate a wafer edge expose unit 22 and a wafer 20, during processing, as currently used in the industry. The WEE unit position is referenced to the resist coatings unit itself and does not account for many key variations such as the placement of the wafer on the unit, variations in wafer diameter, and placement of previous WEE layers.

The present invention provides for the incorporation of a sensor into a wafer edge processing unit, such as a wafer edge expose unit, for sensing an edge of the wafer. A sensor method that does not physically contact the wafer, such as commonly available light or capacitance based sensors, is preferred. The present invention may also provide for the use of a light or energy-emitting source, such a laser, along with use of the sensor, wherein the sensor senses the light or energy emitted from the source. Regardless, by sensing the edge of the wafer, the present invention compensates for tolerances when aligning the wafer edge expose unit relative to the wafer edge.

Figure 3:
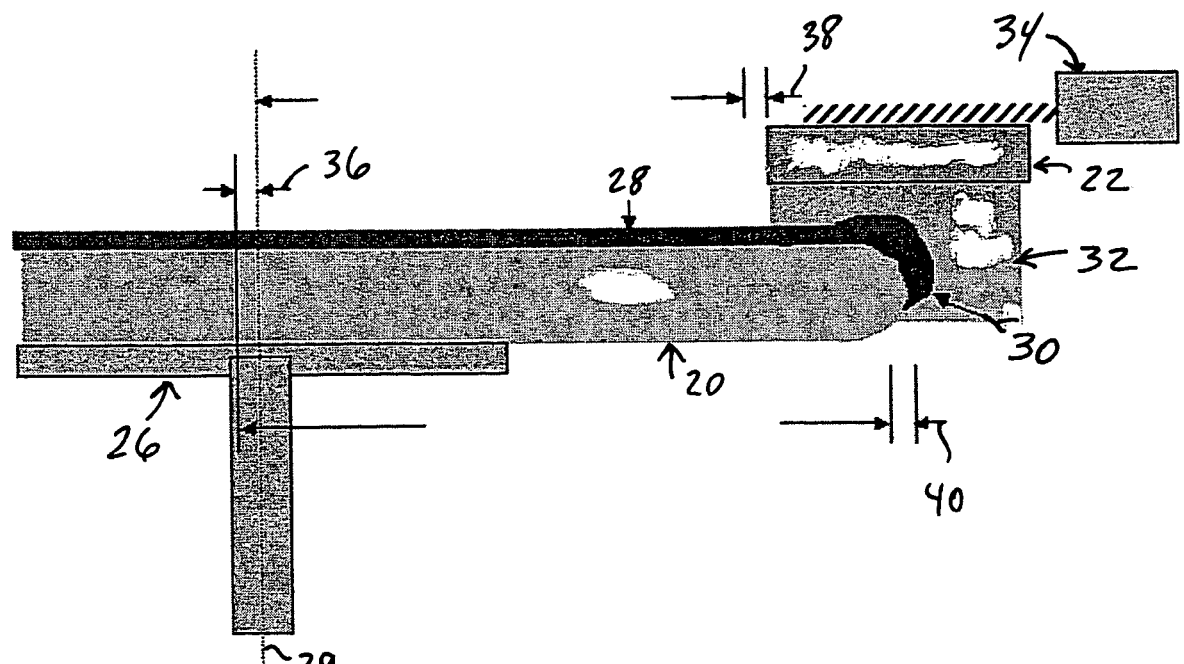
FIG. 3 provides a side view of that which is shown in FIG. 2.
Figure 4:
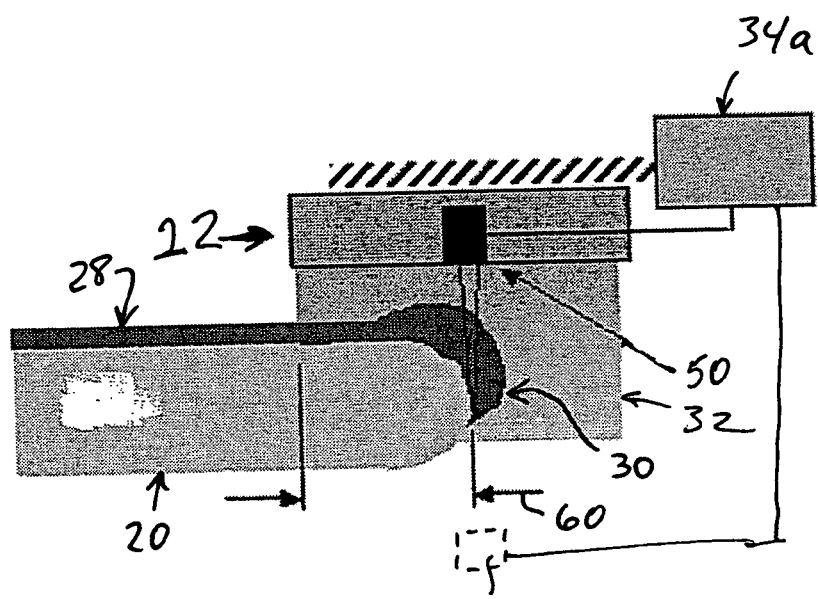
FIG. 4 is similar to FIG. 3, but shows an embodiment of the present invention, wherein a laser and sensor are incorporated into the wafer edge expose unit in a feedback loop so the wafer edge expose unit follows the wafer edge.

FIG. 4 is similar to FIG. 3, but illustrates a specific embodiment of the present invention, wherein a sensor 50 is incorporated into the wafer edge expose unit 22. More specifically, reference numeral 50 in FIG. 4 identifies a sensor as well as possibly a corresponding light source. For example, one embodiment provides that 50 is a combined laser and reflectance sensor. Another embodiment provides that 50 is an ambient light CCD sensor or a capacitance sensor. Still another embodiment provides that 52 is a light source positioned on one side of the wafer and a corresponding sensor 50 is positioned on the opposite side of the wafer, where the sensor 50 senses the light from the light source 52. Regardless, preferably the wafer edge expose unit 22 is positioned depending on what is sensed by the sensor 50 with regard to the wafer edge. As such, the wafer edge expose unit 22 is referenced to the wafer edge, and tolerances are compensated for when aligning the wafer edge expose unit 22.

There are several modes that the sensor could be used in. One approach would be to place the WEE unit 22 in a fixed but accurate location at the beginning of the WEE process (reference numeral 60 in FIG. 4 identifies the wafer edge to wafer edge expose unit offset). Another approach would be to have the WEE drive controller 34a actively follow the edge of the wafer 20 as it rotates during the WEE process, which has the advantage of compensating for any wafer centering errors (i.e., dimension 36 in FIG. 3) as well as diameter and placement errors (such as dimension 40 in FIG. 3). In other words, the wafer edge is dynamically tracked and followed during processing.

Figure 5:
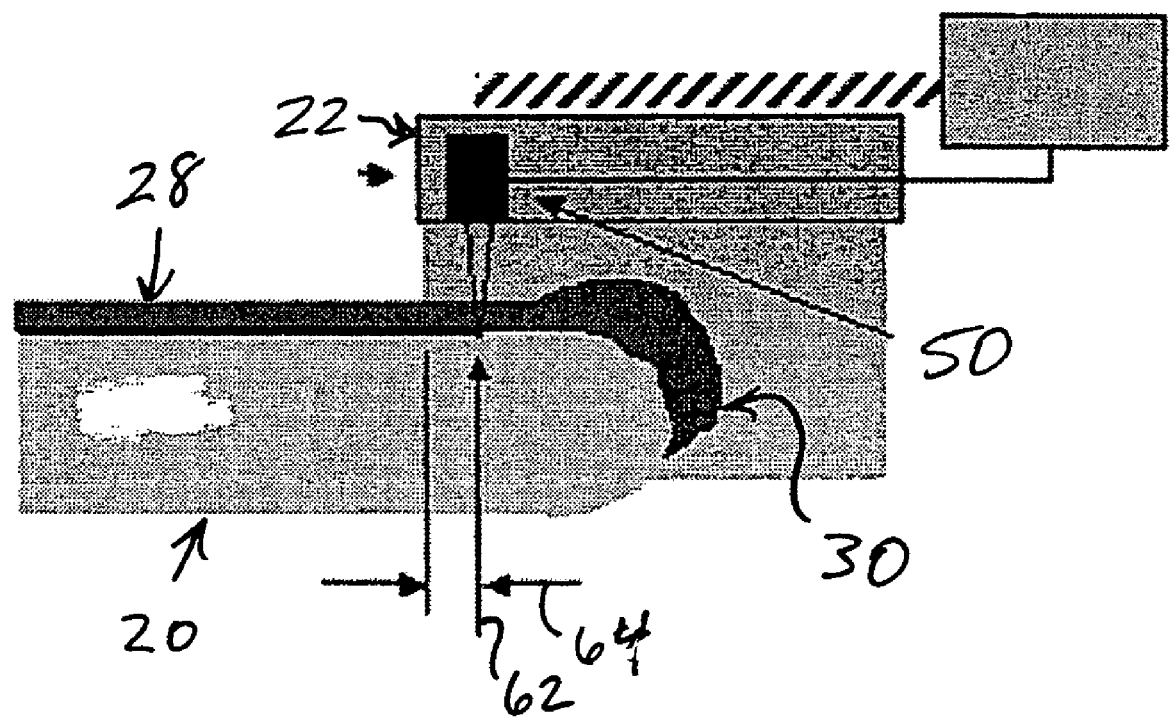
FIG. 5 is similar to FIG. 4, but shows another embodiment of the present invention, wherein the laser and sensor are incorporated into the wafer edge expose unit in a feedback loop so the wafer edge expose unit follows a previous WEE layer edge.

In another approach, the edge sensor 50 is used to sense and track the edge of a previous layer WEE pattern as shown in FIG. 5. In FIG. 5, line 62 identifies a previous layer WEE edge, and reference numeral 64 identifies the previous WEE edge to next WEE edge offset.

Figure 6:
FIG. 6 provides a flow chart of a method of measuring the distance from an edge of a wafer to a WEE edge feature, where the method is in accordance with an embodiment of the present invention.

Another use of a sensor equipped WEE unit with an accurate drive unit like a stepper motor is to measure the distance from the edge of the wafer to a WEE edge feature. To do this, as shown in FIG. 6, the sensor is driven from the feature to the edge while counting the motor steps. The sensor signal is measured to detect the WEE layer edges or wafer edge. The stepper motor counts are then multiplied by the distance per step to calculate the total distance between edge features.

The present invention is generally directed at compensating for wafer and machine tolerances to accurately place the wafer edge expose unit relative to the wafer edge (or a previous WEE layer) so that the IRTS roadmap of 1 millimeter edge exclusion can be achieved. However, the present invention can also be employed in connection with other non-WEE edge processing, such as wet edge etch on a spin processor or a directed plasma edge etch.

While embodiments of the present invention are shown and described, it is envisioned that those skilled in the art may devise various modifications of the present invention without departing from the spirit and scope of the appended claims.

What is claimed is:

1. A system for exposing an edge of a wafer, said system comprising:
    means for holding and rotating the wafer; a single wafer edge expose unit which comprises a light source and a sensor which is incorporated into the wafer edge expose unit, wherein said light source comprises an ultraviolet light source for emitting ultraviolet light and exposing the edge of the wafer, said system further comprising a secondary light source spaced away from the single wafer edge expose unit and configured to emit light toward the light source of the wafer edge expose unit, wherein the sensor of the wafer edge expose unit is configured to sense, from within the ultraviolet light, the light emitted from the secondary light source through the ultraviolet light, and the system is configured to use the ultraviolet light to expose the edge of the wafer and use the sensor and the secondary light source to sense the edge of the wafer; and means for moving the single wafer edge expose unit depending on what the sensor senses.

2. A system as recited in claim 1, wherein the means for holding and rotating the wafer comprises a wafer chuck.

3. A system as recited in claim 1, wherein the means for moving the single wafer edge expose unit comprises a drive motor and a controller connected to said drive motor, wherein said sensor of the wafer edge expose unit is connected to said controller.

4. A system as recited in claim 3, wherein the controller is configured to position said single wafer edge expose unit depending on what is sensed by the sensor.

5. A method of exposing the edge of a wafer, said method comprising: providing a system which comprises a single wafer edge expose unit which comprises a light source and a sensor which is incorporated into the wafer edge expose unit, wherein the light source comprises an ultraviolet light source for emitting ultraviolet light and exposing the edge of the wafer, further comprising providing that the system further comprises a secondary light source spaced away from the single wafer edge expose unit and configured to emit light toward the light source of the wafer edge expose unit, using the sensor of the wafer edge expose unit to sense, from within the ultraviolet light, the light emitted from the secondary light source through the ultraviolet light; using the ultraviolet light to expose the edge of the wafer and using the sensor and the secondary light source to sense the edge of the wafer; and moving the single wafer edge expose unit depending on what the sensor senses.

6. A method as recited in claim 5, further comprising using a wafer chuck to hold and rotate the wafer.

\* \* \* \* \*